April 25, 1950

R. W. KETCHLEDGE 2,505,550

AUTOMATIC VOLUME CONTROL CIRCUITS

Filed Aug. 7, 1945

2 Sheets-Sheet 1

INVENTOR
R. W. KETCHLEDGE
BY
Earl C. Laughlin
ATTORNEY

AUTOMATIC VOLUME CONTROL CIRCUITS

Filed Aug. 7, 1945 2 Sheets-Sheet 2

INVENTOR
R. W. KETCHLEDGE
BY
Earl C. Laughlin
ATTORNEY

Patented Apr. 25, 1950

2,505,550

UNITED STATES PATENT OFFICE 2,505,550

AUTOMATIC VOLUME CONTROL CIRCUITS

Raymond W. Ketchledge, Jamaica, N. Y., assignor to Bell Telephone Laboratories, Incorporated, New York, N. Y., a corporation of New York Application August 7, 1945, Serial No. 609,415

4 Claims. (Cl. 179—171)

Figure 1:
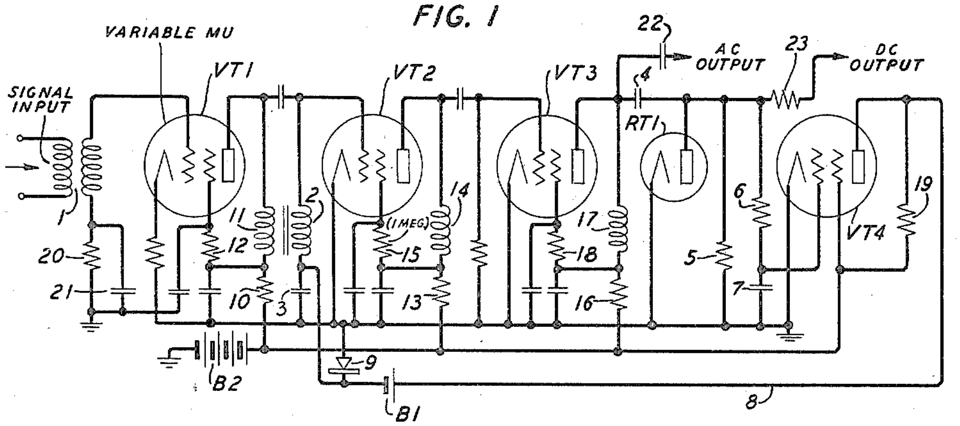

The invention relates to signaling systems and particularly to circuits for automatically controlling the amplification or volume of signals transmitted over such a system.

An object of the invention is to automatically control the gain of a vacuum tube amplifier in a signal transmission system so as to maintain its output signal energy level substantially constant for varying signal input levels.

A more specific object is to provide an unusually wide range of automatic gain control of a vacuum tube amplifier in a signaling system with a minimum of signal distortion and with the use of relatively low control voltages.

In one conventional method of automatic volume control used in signaling systems, to be referred to hereinafter as a "negative grid AVC," the gain of a vacuum tube amplifier is reduced by the application of negative bias to the control grid of a variable-mu amplifying vacuum tube. The variable-mu characteristic is attained by special construction of the control grid of the tube so as to provide effectively a high mu and a low mu section of the tube in parallel. As the bias is increased, the plate current shifts from the high mu to the low mu section and gain reduction is accomplished. The control voltage is usually obtained by rectification of a portion of the amplifier output, although the rectified output of a second uncontrolled amplifier is sometimes used to provide a forward-acting automatic volume control circuit. In another known type of automatic volume control, to be referred to hereinafter as a "screen grid AVC," the gain of an amplifier is reduced when the signal input level thereto increases above a certain value, by utilizing a rectified portion of the amplifier output to decrease the screen grid potential of one or more of the amplifier tubes, which in turn will decrease the transconductance. In a third type of automatic volume control, to be referred to hereinafter as a "grid-leak AVC," a bias condenser and a leak resistance in parallel are inserted in series with the control grid circuit of an amplifying vacuum tube to provide the AVC action when the applied signal voltage becomes sufficiently high to drive the control grid of the tube positive.

It is known that for given supply voltages there is a rather critical control grid bias voltage for maximum gain of a pentode or tetrode amplifier stage. Deviations in either direction from that value will reduce the gain. In accordance with the present invention, this characteristic is utilized to provide an automatic gain or volume control circuit which resembles the first AVC circuit described above in that the output voltage of a vacuum tube amplifier is rectified and fed back to control the bias on the control grid of one or more of its vacuum tubes, but, contrary to the usual practice, the polarity of the rectified control voltage is made positive with respect to the potential of the control grid. Also, to make the control more effective, the screen grid of the controlled vacuum tube is fed through a dropping resistor and the input coupling impedance is made high at the signal frequency but the direct current signal path is made of low resistance. To provide increased protection from very strong signal input levels, this positive AVC control may be supplemented by employing a grid-leak AVC in connection with a preceding amplifier stage.

In a modification of the positive grid AVC in accordance with the invention, the positive control voltage used to reduce the amplifier gain is derived from a rectifier and cathode-follower combination.

Figure 2:
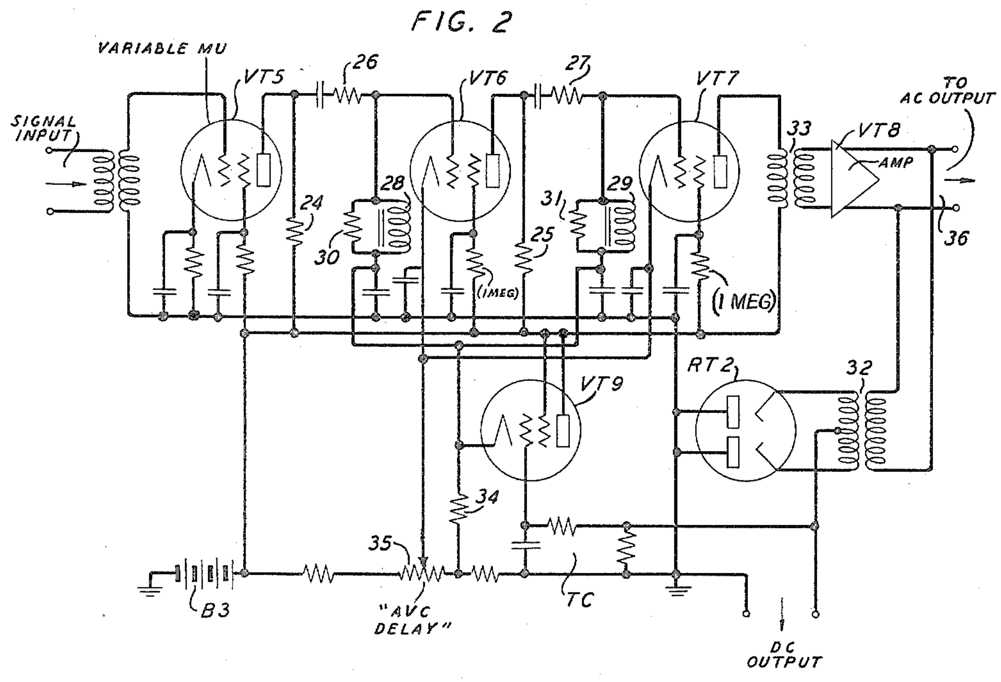

The various objects and features of the invention will be better understood from the following detailed description when read in conjunction with the accompanying drawings in which:

Figs. 1 and 2 show schematically signal receiver circuits embodying different modifications of the invention; and Figs. 3 to 7 show curves illustrating the distortion and control characteristics for a positive grid AVC in accordance with the invention and comparative characteristics of negative-grid and grid-leak AVC circuits under various conditions.

In the signal receiver of Fig. 1, received alternating current signals subject to wide variations in amplitude are impressed through input transformer 1 on an alternating current amplifier of conventional type comprising three impedance-capacitance coupled tetrode amplifying stages VT1, VT2 and VT3 the circuit constants of which are selected to provide the desired amount of signal amplification in the output of the third stage tube VT3. A grid-leak AVC is applied to the first amplifier stage VT1, which employs a variable-mu tube, and a positive-grid AVC to the second amplifier stage VT2, which does not require a variable-mu tube to provide the desired action although such a tube may be used.

A choke coil 2 and a condenser 3 are connected in series between the control grid and cathode of the second stage tetrode VT2. A variable bias voltage for controlling the control grid potential of the tetrode VT2 is derived from the output of the third amplifier stage VT3, which operates uncontrolled, by a diode rectifier RT1 which is bridged across the plate circuit of the tetrode VT3 in series with the isolating condenser 4. A direct current amplifier comprising a fourth tetrode VT4 has its control grid circuit coupled to the output of the diode rectifier RT1 through a network comprising the resistors 5 and 6 and the condenser 7. A variable bias lead 8, including the small battery B1 poled as shown, is connected between the plate of the direct current amplifier tetrode VT4 and a point between the choke coil 2 and the condenser 3 in the control grid circuit of amplifier tube VT2. The battery B1 provides a normal small negative bias on the control grid of the amplifier tube VT2 such as to provide a maximum amount of gain in that tube. A copper oxide rectifier 9 poled as shown, is connected between the lead 8 and ground for a purpose which will be described later in connection with the description of operation of the positive-grid AVC applied to VT2.

The filaments or cathodes of the amplifier tubes VT1 to VT4 and the filament of the rectifier tube RT1 are heated to incandescence from a suitable source of potential (not shown) which may be a direct current battery. The plates or anodes and the screen grids of the amplifier tubes VT1 to VT4 are biased to the proper operating potentials from a common source of space current, which is shown as a direct current battery B2 but which may comprise a rectifier supplied from a commercial alternating current power source. As shown, the proper biasing potentials are obtained by connecting the positive terminal of the battery B2 to the plate of the variable-mu tube VT1 through the resistor 10 and the high impedance inductance coil 11, and to the screen grid of that tube through resistor 10 and resistor 12 in series; to the plate of the amplifier tube VT2 through the resistor 13 and the high impedance inductance coil 14 in series, and to the screen grid of that tube through the resistor 13 and the resistor 15 of relatively high value (1 megohm) in series; to the plate of the amplifier tube VT3 through resistor 16 and the high impedance inductance coil 17 in series, and to the screen grid of that tube through resistor 16 and the resistor 18 in series; and to the plate of amplifier tube VT4 through the series resistor 19, and directly to the screen grid of the latter tube.

The grid leak AVC is employed for the first amplifier stage VT1 to provide protection from very strong signal input levels. It consists of a leak resistor 20 and by-pass condenser 21 in parallel, connected in series with the control grid circuit of that amplifier stage. When the amplitude of the input signal applied to the control grid VT1 is so large as to cause the flow of control grid current, a negative bias will be built up across the grid-leak circuit which will serve to reduce the gain of the variable-mu tube VT1 proportionately. The direct current resistance in the control grid circuit of VT1, exclusive of the grid-leak, should be relatively low in order to obtain the required "hold over" of the AVC control voltage. The value of the grid-leak 20 itself should be high in order to limit the grid current flow to very small values, thus reducing distortion. This method produces some distortion and is severely limited in range due to the fact that the tube must operate over a highly curved portion of its characteristic if reasonable gain is to be obtained, and requires large signal input levels for operation. It does, however, provide a very constant output level and because of its "forward" action permits fast time constants to be employed without "motorboating" difficulties. With a low plate load impedance, the distortion and gain will both be less.

The positive-grid AVC arrangement functions as follows: The high amplitudes in the input signals to the receiver not compensated for by the grid-leak AVC associated with the first amplifier stage VT1 will be further amplified in the amplifier stages VT2 and VT3. A portion of these amplified signals in the output of VT3 will be rectified by the diode rectifier RT1 bridged across its plate circuit. The rectified voltages will be amplified by the direct current amplifier stage VT4 causing the potential of the plate of the latter tube to be made more positive as the amplitude of the input signal increases. The resulting varying positive direct current voltage applied to the control grid of the amplifier tube VT2 through bias lead 8 and choke coil 2 will overcome the normal negative bias on that grid applied by battery B1 and will cause that grid to be positively biased in accordance with the strength of the input signals to the receiver. As the control grid of the amplifier tube VT2 is made more positive, in response to the AVC control voltage supplied through lead 8 when the signal input level to input transformer 1 increases above a given value, the screen grid voltage, which is supplied through the high resistance 15, the value of which resistance was selected to be approximately 1 megohm for the particular tube used, decreases, lowering the tube gain. In addition, the control grid-to-cathode impedance is reduced by virtue of the flow of control grid current thus lowering further the effective gain of this amplifier stage. At the limit of control, the screen grid voltage will be only a small fraction of a volt positive and the control grid voltage will be a few volts positive. Thus the gain of the stage is reduced and the amplitude level of the alternating current signals applied to the control grid of the third amplifier stage VT3 is reduced.

The input coupling impedance to the amplifier tube VT2 to which the positive-grid AVC is applied, is made high at the signal frequency (due to the high plate impedance of the preceding variable-mu tube VT1 and the high impedance coil 11 in its plate circuit) to permit good control grid-to-cathode shunting, while the direct current input path to the tube VT2 is made low in resistance (due to the effect of the choke coil 2 in the control grid circuit) to permit adequate control grid current flow with a minimum of control voltage.

The function of the copper oxide rectifier 9 connected between the bias lead 8 and ground is to stabilize the bias on the control grid of VT2 at the desired negative value when there is no input signal present. The rectifier 9 is poled so that it provides a high impedance to any applied positive control voltage and therefore, will not prevent the positive variations of the control voltage from being applied to the control grid of tube VT2. The poling of the rectifier however is such as to offer a low impedance to any negative control voltage applied from bias lead 8. Such a negative voltage may be present in the lead 8 when the input alternating current signals are relatively weak, due to voltage drift caused by tube ageing, battery fluctuations, etc. tending to make the resultant potential at the plate of the direct current amplifier tube VT4 negative. In this case, the negative current in lead 8 will be by-passed to ground through the rectifier 9 and will not reach the control grid of the amplifier tube VT2.

The circuit constants in the receiver of Fig. 1 are selected so that the signal level at the control grid of the controlled amplifier stage VT2, at the time of initiation of AVC control is low to prevent distortion but high enough to prevent excessive noise level. At the initiation of the AVC, current will flow to the grid of the controlled tube tending to produce "shot-effect" noise. This shot-effect is minimized in the circuit of Fig. 1 by effecting control in the second stage rather than the first.

The substantially constant level amplified alternating signals produced in the circuit of Fig. 1 as a result of the automatic volume control actions described may be taken off from the output of the third amplifier stage VT3 through condenser 22. Substantially constant level amplified direct current signals may be taken off from the output of the diode rectifier RT1 through resistance 23.

Fig. 2 shows a part of a signal receiver including an amplifier comprising three resistance-capacitance coupled tetrode amplifying stages VT5, VT6 and VT7, adapted for transmitting a relatively narrow, high frequency signal frequency band, and a modified form of positive grid AVC in accordance with the invention applied to the second and third amplifier stages VT6 and VT7. The positive grid AVC differs essentially from that shown in Fig. 1 in the following respects.

As the amplifiers stages VT5 and VT6 employ very low impedance plate circuit resistors 24 and 25, respectively, the series resistors 26 and 27 are provided in the coupling networks between amplifier stages VT5 and VT6, and VT6 and VT7, respectively to build up the input alternating current impedances of tubes VT6, VT7 to the high values required to permit good control-grid to cathode shunting at the signal frequency. The choke coils 28 and 29 are connected in series with the control grid-cathode circuits of the controlled amplifier stages VT6 and VT7, respectively, to make these circuits of sufficiently low direct current resistance to permit adequate flow of control grid current with a minimum of control voltage, and to provide a high impedance in these circuits to the signal frequencies. The resistors 30 and 31 are connected across the grid coils 28 and 29, respectively, for stabilizing the impedance and giving a flat gain characteristic over the operating frequency range.

The positive voltages applied to the control grids of the amplifier stages VT6 and VT7 to reduce the amplifier gain when the input signal amplitude level increases above a given value, are derived from the output of the third amplifier stage VT7 through a rectifier and cathode-follower combination instead of from a rectifier and direct current amplifier combination such as is used in the receiver of Fig. 1. As shown, the input of the double diode full-wave rectifier RT2 is coupled to the plate circuit of the third amplifier stage VT7 by transformers 32 and 33 and an intermediate stage VT8 of alternating current amplification. The output of the rectifier RT2 is connected through the AVC resistance-condenser time constant circuit TC to the control grid circuit of the tetrode cathode-follower tube VT9. The cathode resistor 34 of the cathode follower tube VT9 and the resistance potentiometer 34 in series are connected in common to the control grid-cathode circuits of the controlled amplifier tubes VT6 and VT7 in series with the parallel grid coil and resistor circuits 28, 30 and 29, 31, respectively. The plate and screen grid of the cathode follower tube VT9 are biased to the same positive potential from a common battery B3 employed also for providing the operating biases on the plates and screen grids of the amplifiers VT5 to VT7 through circuits similar to those employed for biasing the same elements in the corresponding alternating current amplifier tubes B81 to VT3 in the receiver of Fig. 1.

The purpose of the cathode-follower in the circuit of Fig. 2 is to provide the necessary positive control current to the control grids of the second and third amplifier stages VT6 and VT7 without appreciable loading of the envelope rectifier RT2 which may be utilized also for demodulating the high frequency alternating signals for supply to a direct current output circuit as shown. It is also desirable to use a high impedance level in the AVC time-constant circuit TC, thereby permitting the use of smaller condensers and a time constant independent of signal level. The characteristics of the AVC circuit are variable, depending upon the adjustment of the "AVC delay" control comprising the resistance potentiometer 35 in the cathode follower output. An alternating current output circuit 36 is connected to the output of the fourth alternating current amplifier stage VT8. The positive direct current control voltage appearing in the cathode follower output of the tube VT9 in response to an increase above a given value in the level of the alternating current supplied to the first stage VT5 of the alternating current amplifier, is applied to the control grids of the amplifier tubes VT6 and VT7 and operates in a manner similar to that described for the controlled amplifier VT2 in the receiver of Fig. 1 to maintain the output level of the signals in the alternating current output circuit 36 and in the direct current output circuit connected to the output of rectifier RT2 substantially constant for a wide range of signal input levels.

Figures 3, 4, 5, 6, 7:
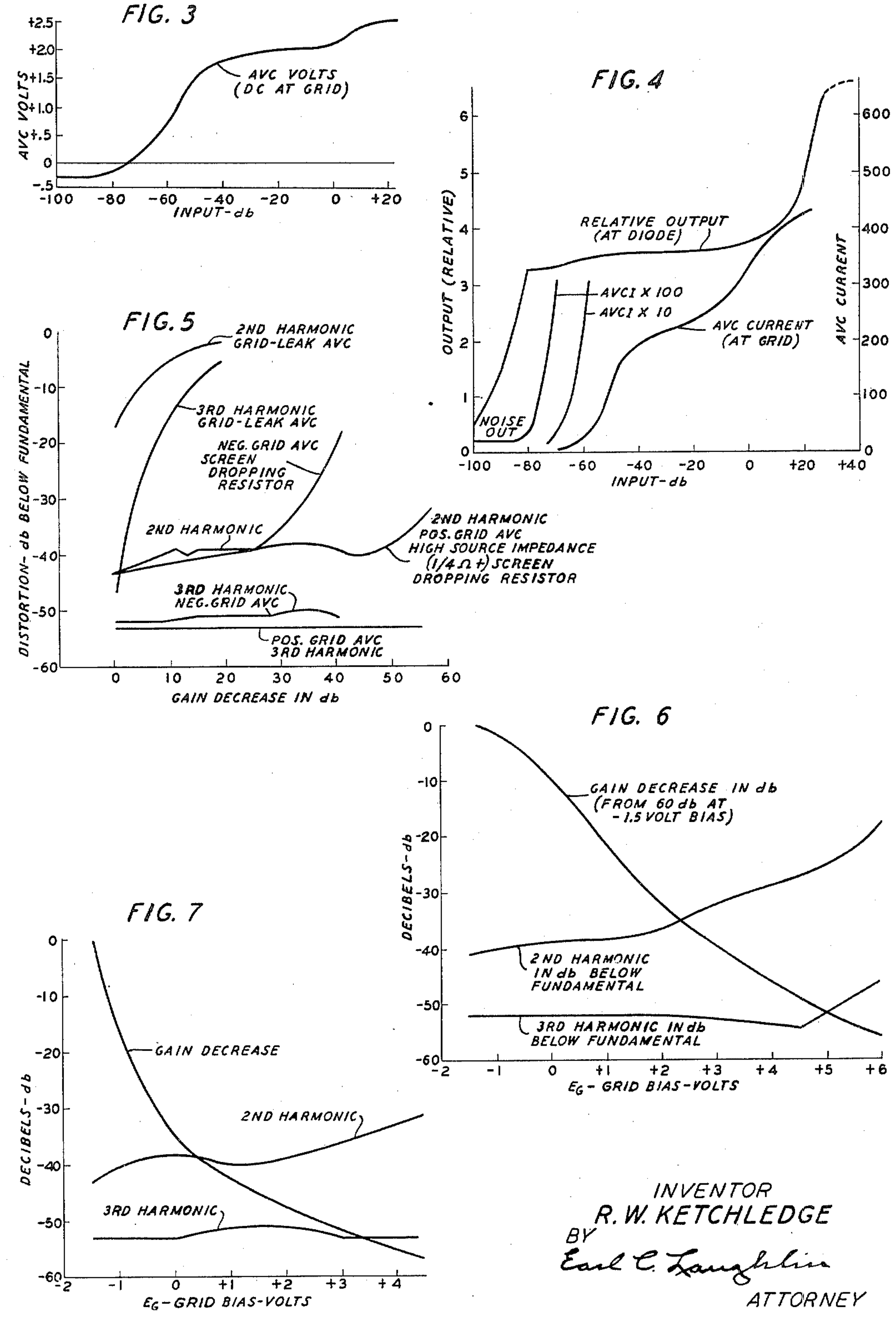

Figs. 3 to 7 show curves illustrating the distortion and control characteristics for positive-grid AVC circuits in accordance with the invention and comparative distortion and control characteristics for negative-grid and grid-leak AVC circuits under various conditions of operation, attained by actual tests of circuits which have been constructed. To obtain these characteristic curves, the output level was held constant at one milliwatt (except for the grid-leak AVC) and the input level was varied together with the control voltage. Figs. 3 and 4 show the control characteristics obtained for a typical positive-grid AVC circuit such as shown in Fig. 1. It will be noted that satisfactory control is attained in one stage over an 80-decibel range (a later design extended this range to 90 decibels by the use of higher initial gain in the controlled stage). Fig. 5 shows a typical comparison of the distortion characteristics of a positive-grid AVC circuit in accordance with the invention and a negative-grid and grid-leak AVC under similar operating conditions. It can be seen from these curves that the positive-grid AVC may be operated with no more distortion than the conventional negative-grid AVC and at the same time provides a greater control range. Figs. 6 and 7 show curves illustrating the distortion characteristics of typical positive grid AVC circuits in accordance with the invention under other test conditions. It will be noted from the curves of Figs. 3 to 7 that the gain reduction per stage obtained with proper circuit conditions for a positive grid AVC in accordance with the invention is considerably in excess of that obtainable with a negative-grid AVC, and the former is much more sensitive to control voltage. A characteristic difference between the positive-grid AVC method as described above and the negative-grid AVC method is that the former requires grid-current flow for operation.

Although tetrode tubes are used in the controlled amplifier stages for the positive-grid AVC circuit of the invention as illustrated in the drawings and described above, the method is applicable as well to circuits employing pentodes for the controlled amplifier tubes.

Various other modifications of the circuits illustrated and described which are within the spirit and scope of the invention will occur to persons skilled in the art.

What is claimed is:

1. In combination, a source of alternating current signals of varying amplitudes, a signal amplifier supplied from said source, comprising one or more vacuum tube amplifying stages each including a cathode, an anode, a control grid and a screen grid, and circuits therefor, and an automatic gain control for said amplifier, comprising means normally biasing the control grids of certain of said vacuum tube stages to those voltage values which will permit operation of said certain stages at maximum gain, means to derive from the signal output of said amplifier, when the signal input amplitude level thereto exceeds a predetermined value, a proportional direct current voltage, means to apply the derived voltage as a control bias to the control grids of said certain stages with a polarity which is maintained positive with respect to the normal biasing potentials on said grids, so as to reduce the gain of said amplifier and a capacitively by-passed resistor of relatively high value in the screen grid circuit of each of said certain vacuum tube stages, the voltage drop produced in said resistor by the flow of screen grid current therethrough when the control grid of that stage is made more positive by the applied positive rectified voltage reducing the screen grid voltage so as to provide further reduction in amplifier gain.

2. The combination of claim 1, in which to make the automatic gain control more effective the alternating current input coupling impedance to each of said certain stages is made high at the signal frequencies relative to the input impedance of that stage so as to produce a large change in the control grid-to-cathode impedance of each stage due to the flow of control grid current when the control grid is made more positive and the direct current resistance in the control grid circuit of each of said certain stages is made sufficiently low in value to permit control grid current flow with a minimum of applied control voltage.

3. The combination of claim 1, in which, to prevent false operation of said automatic gain control during intervals of application of weak alternating current signals to said amplifier, due to circuit variations tending to make the resultant direct current potential on the control grids of said certain amplifying stages negative, a suitably poled rectifier is connected between said direct current voltage deriving means and ground to by-pass the negative control voltages to ground.

4. The combination of claim 1, in which said automatic gain control is made more effective by the provision of a choke coil of suitable value in series with the control grid circuit of each of said certain vacuum tube stages to provide a path of low impedance to direct current and of high impedance to the signal frequencies.

RAYMOND W. KETCHLEDGE.

REFERENCES CITED

The following references are of record in the file of this patent:

UNITED STATES PATENTS

| Number | Name | Date |
|---|---|---|
| 1,893,545 | Gannett | Jan. 10, 1933 |
| 1,985,914 | Carlson | Jan. 1, 1935 |
| 1,998,619 | Hammond | Apr. 23, 1935 |
| 2,096,759 | Purington | Oct. 26, 1937 |
| 2,295,410 | Kreuzer | Sept. 8, 1942 |
| 2,367,357 | Koch | Jan. 16, 1945 |